United States Patent
Narayanan et al.

(10) Patent No.: US 8,743,653 B1
(45) Date of Patent: Jun. 3, 2014

(54) REDUCING DYNAMIC POWER CONSUMPTION OF A MEMORY CIRCUIT

(75) Inventors: Sridhar Narayanan, Cupertino, CA (US); Sridhar Subramanian, Cupertino, CA (US); Subodh Kumar, San Jose, CA (US); Matthew H. Klein, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 150 days.

(21) Appl. No.: 13/528,620

(22) Filed: Jun. 20, 2012

(51) Int. Cl.
*G11C 7/22* (2006.01)
*G11C 7/10* (2006.01)
*G11C 11/4076* (2006.01)

(52) U.S. Cl.
CPC ............. *G11C 7/22* (2013.01); *G11C 7/1072* (2013.01); *G11C 7/222* (2013.01); *G11C 7/1051* (2013.01); *G11C 11/4076* (2013.01)
USPC ................ 365/233.1; 365/233.11; 365/226

(58) Field of Classification Search
CPC ........ G11C 7/22; G11C 7/1072; G11C 7/222; G11C 7/1051; G11C 11/4076
USPC ................... 365/233.1, 233.11, 226
See application file for complete search history.

(56) References Cited

U.S. PATENT DOCUMENTS

| | | | |
|---|---|---|---|
| 4,354,259 A | 10/1982 | Ishimoto | |
| 5,438,548 A | 8/1995 | Houston | |
| 5,481,690 A | 1/1996 | Grumlose et al. | |
| 5,835,435 A | 11/1998 | Bogin et al. | |
| 5,864,509 A | 1/1999 | Anumula | |
| 6,356,500 B1 | 3/2002 | Cloud et al. | |
| 6,760,810 B2 | 7/2004 | Yamazaki et al. | |
| 7,281,093 B1 | 10/2007 | Kulkarni et al. | |
| 7,352,647 B1 | 4/2008 | Saini | |
| 7,443,759 B1 | 10/2008 | Rowlands et al. | |
| 7,498,836 B1 | 3/2009 | Tuan | |
| 7,502,977 B2 | 3/2009 | Venkatraman et al. | |
| 7,529,955 B2 | 5/2009 | Kurts et al. | |
| 7,620,926 B1 | 11/2009 | Tuan | |
| 7,714,610 B2 | 5/2010 | He | |
| 7,796,458 B2 | 9/2010 | Rao | |
| 7,863,930 B2 | 1/2011 | Nishioka | |
| 7,863,971 B1 | 1/2011 | Nayak et al. | |
| 7,865,747 B2 | 1/2011 | Buyuktosunoglu et al. | |
| 8,098,540 B2 | 1/2012 | Rao et al. | |
| 2004/0085845 A1* | 5/2004 | Ooishi .......................... 365/226 |

OTHER PUBLICATIONS

U.S. Appl. No. 12/835,638, filed Jul. 13, 2010, Manovit et al.

(Continued)

*Primary Examiner* — Jason Lappas
(74) *Attorney, Agent, or Firm* — Kevin T. Cuenot; Lois D. Cartier

(57) ABSTRACT

A circuit can include address evaluation circuitry coupled to an address bus of a memory and configured to generate a first control signal responsive to determining that an address on the address bus has not changed for a current clock cycle from a previous clock cycle. The circuit can include write enable evaluation circuitry coupled to the memory and configured to generate a second control signal responsive to determining that a write enable signal of the memory is de-asserted for the current clock cycle and for the previous clock cycle. The circuit can include clock enable circuitry coupled to a clock enable port of the memory and configured to generate a clock enable signal to the clock enable port of the memory responsive to the first control signal and the second control signal.

13 Claims, 4 Drawing Sheets

(56) References Cited

OTHER PUBLICATIONS

U.S. Appl. No. 13/300,512, filed Nov. 18, 2011, Narayanan et al.
Abusaidi, Peggy et al., *Virtex-5 FPGA System Power Design Considerations*, WP285 (v1.0), Feb. 14, 2008, pp. 1-23, Xilinx, Inc., San Jose, California, USA.
Amrutur, B.S. et al., "Techniques to Reduce Pose in Fast Wide Memories," *Technical Digest of the 1994 IEEE Symposium on Low Power Electronics*, Oct. 10, 1994, pp. 92-93, IEEE, Piscataway, New Jersey, USA.
Hussein, Jameel et al., *Lowering Power at 28 nm with Xilinx 7 Series FPGAs*, EP389 (v1.0), Feb. 24, 2011, pp. 1-23, Xilinx, Inc., San Jose, California, USA.
Le, Hoang et al., "Scalable High Throughput and Power Efficient IP-Lookup on FPGA," *Proc. of the IEEE 17th Symposium on Field Programmable Custom Computing Machines*, Apr. 5, 2009, pp. 167-174, IEEE, Piscataway, New Jersey, USA.
Liu, Ming et al., "Run-Time Partial Reconfiguration Speed Investigation and Architectural Design Space Exploration," *Proc. of the Int'l Conf. on Field Programmable Logic and Applications*, Aug. 31, 2009, pp. 498-502, IEEE, Piscataway, New Jersey, USA.
Liu, Shaoshan et al., *Energy Reduction with Run-Time Partial Reconfiguration*, Microsoft Research Technical Report MSR-TR-2009-2017, Sep. 2009, pp. 1-12, Microsoft Research, Redmond, Washington, USA.
Paulsson, Katarina et al., "Cost-and Power Optimized FPGA based System Integration: Methodologies and Integration of a Low-Power Capacity-based Measurement Application on Xilinx FPGAs," *Proc. of the Conference on Design, Automation and Test in Europe*, Mar. 10, 2008, pp. 50-55, IEEE, Piscataway, New Jersey, USA.
Rivoallon, Frederic, *Reducing Switching Power with Intelligent Clock Gating*, WP370 (v1.2), Oct. 5, 2010, pp. 1-7, Xilinx, Inc., San Jose, California, USA.
Tessier, Russell et al., "Power-aware RAM Mapping for FPGA Embedded Memory Blocks," *Proc. of the 2006 ACM/SIGDA 14th International Symposium on Field Programmable Gate Arrays*, Feb. 22, 2006, pp. 189-198, ACM, New York, New York, USA.
Tiwari, Anurag et al., "Saving Power by Mapping Finite-State Machines Into Embedded Memory Blocks in FPGAs," *Proc. of the Design, Automation and Test in Europe Conference and Exhibition*, Feb. 16, 2004, pp. 916-921, vol. 2, IEEE, Piscataway, New Jersey, USA.
Xilinx, Inc., *IP Processor Block RAM (BRAM) Block* (v1.00a), DS444, Mar. 1, 2011, pp. 1-7, Xilinx, Inc., San Jose, California, USA.
Zhang, Kevin et al., "SRAM Design on 65-nm CMOS Technology With Dynamic Sleep Transistor for Leakage Reduction," *IEEE Journal of Solid-State Circuits*, Apr. 2005, pp. 895-901, vol. 40, No. 4, IEEE, Piscataway, New Jersey, USA.

\* cited by examiner

REDUCING DYNAMIC POWER CONSUMPTION OF A MEMORY CIRCUIT

FIELD OF THE INVENTION

One or more embodiments disclosed within this specification relate to memories and, more particularly, to reducing dynamic power consumption of a memory.

BACKGROUND

Power consumption of an electronic circuit is generally characterized in terms of static power consumption and dynamic power consumption. Static power consumption refers to power that is dissipated by the circuit due largely to leakage currents. Dynamic power consumption refers to power that is dissipated by the circuit due to signal transitions within the circuit. In general, the higher the operational frequency of a circuit, the more frequent signal transitions occur, which leads to greater dynamic power dissipation by the circuit.

SUMMARY

One or more embodiments disclosed within this specification relate to memories and, more particularly, to reducing dynamic power consumption of a memory.

An embodiment can include a circuit. The circuit can include address evaluation circuitry coupled to an address bus of a memory and configured to generate a first control signal responsive to determining that an address on the address bus has not changed for a current clock cycle from a previous clock cycle. The circuit also can include write enable evaluation circuitry coupled to the memory and configured to generate a second control signal responsive to determining that a write enable signal of the memory is de-asserted for the current clock cycle and for the previous clock cycle. The circuit further can include clock enable circuitry configured to generate a clock enable signal coupled to a clock enable port of the memory responsive to the first control signal and the second control signal.

In one aspect, the address evaluation circuitry, the write enable evaluation circuitry, and the clock enable circuitry can be incorporated within the memory. In another aspect, the address evaluation circuitry, the write enable evaluation circuitry, and the clock enable circuitry can be implemented using programmable circuit blocks.

In another aspect, the address evaluation circuitry can include a delay circuit element configured to receive a clock enable signal of the address bus of the memory and generate a delayed version of the clock enable signal for the address bus as the first control signal.

In a further aspect, the address evaluation circuitry can include a delay circuit element configured to receive the address from the address bus of the memory and generate a delayed version of the address. The address evaluation circuitry also can include a comparison circuit configured to compare the address with the delayed version of the address and output the first control signal as a result of the comparison.

The write enable evaluation circuitry can include a delay circuit element configured to receive the write enable signal and generate a delayed version of the write enable signal and an evaluation circuit configured to determine a union of the write enable signal and the delayed version of the write enable signal and output the second control signal as a result of the union.

The clock enable circuitry can include an evaluation circuit configured to determine a union of the first control signal and the second control signal and output a result of the union as the clock enable signal.

Another embodiment can include a method. The method can include determining that a write enable signal of a memory is de-asserted for a current clock cycle and for a previous clock cycle and determining that an address on an address bus of the memory has not changed for the current clock cycle from the previous clock cycle. Responsive to determining that the write enable signal is de-asserted for the current clock cycle and the previous clock cycle and that the address has not changed for the current clock cycle from the previous clock cycle, a control signal to a clock enable port of the memory can be de-asserted.

In one aspect, determining that the address on the address bus has not changed in the current clock cycle from the previous clock cycle can include determining that a delayed version of a clock enable signal for the address bus is de-asserted for the current clock cycle. In another aspect, determining that the address on the address bus has not changed in the current clock cycle from the previous clock cycle can include comparing an address determined for the current clock cycle with an address determined for the previous clock cycle. For example, a delayed version of the address can be generated. The address can be compared with the delayed version of the address.

Determining that the write enable signal of the memory is de-asserted for the current clock cycle and the previous clock cycle can include determining a union of a write enable signal provided to the write enable port for the current clock cycle and the write enable signal provided to the write enable port for the previous clock cycle. For example, a delayed version of the write enable signal can be generated. A union of the write enable signal and the delayed version of the write enable signal then can be generated.

Another embodiment can include a method. The method can include locating a memory within a programmatic description of a circuit design using a processor, wherein the memory includes a clock enable port, and inserting control circuitry within the circuit design. The control circuitry can be configured to generate a first clock enable signal coupled to the clock enable port of the memory that disables the clock within at least a portion of the memory for a current clock cycle responsive to a predetermined condition.

The predetermined condition can include an address on an address bus for the memory not changing from a previous clock cycle to the current clock cycle and data stored within the memory not changing from the previous clock cycle to the current clock cycle.

Inserting control circuitry can include inserting first control circuitry into the circuit design, wherein the first control circuitry is configured to generate a first control signal responsive to determining that a write enable signal of the memory is de-asserted for the current clock cycle and for a previous clock cycle. Second control circuitry can be inserted into the circuit design, wherein the second control circuitry is configured to generate a second control signal responsive to determining that an address specified by an address bus of the memory has not changed from the previous clock cycle to the current clock cycle. Third control circuitry can be inserted into the circuit design, wherein the third control circuitry is configured to generate the first clock enable signal to the clock enable port of the memory that disables the clock within at least a portion of the memory responsive to the first and the second control signals.

In one aspect, the first control circuitry can include a delay circuit element configured to receive a write enable signal for the write port of the memory and generate a delayed version of the write enable signal. The first control circuitry further can include an evaluation circuit configured to determine a union of the write enable signal and the delayed version of the write enable signal and output the first control signal as a result of the union.

In another aspect, the second control circuitry can include a delay circuit element configured to receive a clock enable signal of the address bus and generate a delayed version of the clock enable signal of the address bus as the second control signal.

In a further aspect, the second control circuitry can include a delay circuit element configured to receive the address from the address bus and generate a delayed version of the address. The second control circuitry also can include a comparison circuit configured to compare the address and the delayed version of the address and output the second control signal as a result of the comparison.

The method also can include augmenting existing control circuitry specified within the programmatic description of the circuit design with the inserted control circuitry and generating a second clock enable signal as a function of a control signal generated by the existing control circuitry and the first clock enable signal generated by the inserted control circuitry. The second clock enable signal can be provided to the clock enable port of the memory.

DETAILED DESCRIPTION

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to memories and, more particularly, to reducing dynamic power consumption of a memory. In one aspect, one or more inputs of a memory can be evaluated for inactivity or quiescence. The state, or value(s), specified by signals provided to the inputs can be evaluated to determine whether data stored within the memory for a current clock cycle has changed compared to a previous clock cycle. In cases where the evaluation indicates that the data stored within the memory has not changed from the previous clock cycle to the current clock cycle, the memory can be disabled for the current clock cycle using a clock enable port of the memory.

In another aspect, a data processing system executing an Electronic Design Automation (EDA) tool can be configured to perform an analysis of a circuit design that includes a memory. The data processing system can insert control circuitry into a circuit design to reduce the dynamic power dissipation of the circuit design. The control circuitry inserted into the circuit design by the data processing system can selectively disable the memory within the circuit design using a clock enable of the memory. The control circuitry can evaluate inputs to the memory for inactivity by determining the state of control signals provided to inputs of the memory as an indication of whether data stored within the memory changed from the previous clock cycle to the current clock cycle. In cases where the data within the memory has not changed, the control circuit is configured to disable the memory for the current clock cycle.

Figure 1:
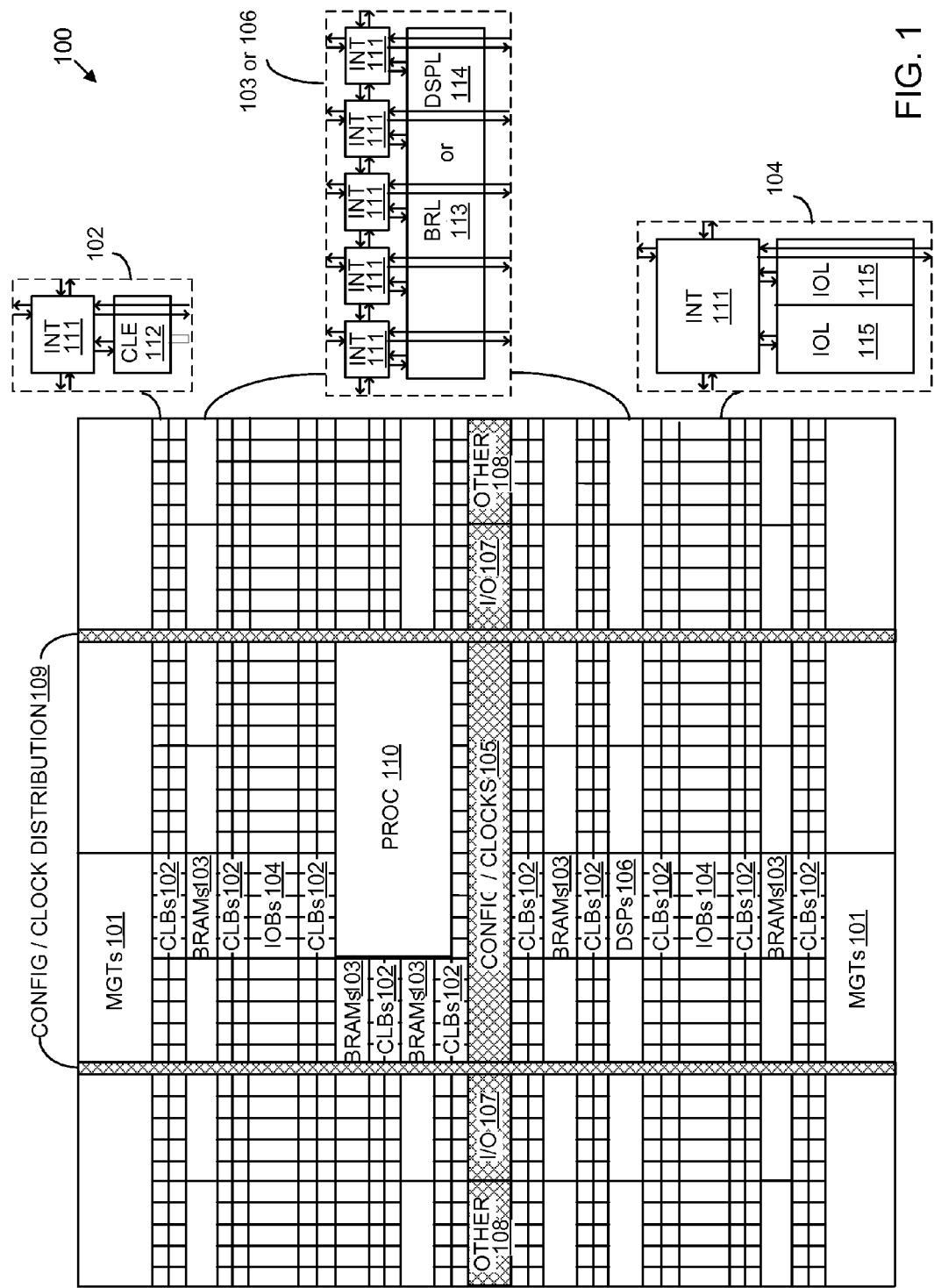
FIG. 1 is a first block diagram illustrating an exemplary architecture for an integrated circuit in accordance with an embodiment disclosed within this specification.

FIG. 1 is a first block diagram illustrating an exemplary architecture 100 for an integrated circuit (IC) in accordance with an embodiment disclosed within this specification. Architecture 100 can be implemented within a field programmable gate array (FPGA) type of IC, for example. As shown, architecture 100 includes several different types of programmable circuit, e.g., logic, blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, the INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of INTs 111. An IOB 104 can include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die, e.g., formed of regions 105, 107, and 108, can be used for configuration, clock, and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks can be programmable blocks and/or dedicated circuitry. For example, a processor block depicted as PROC 110 spans several columns of CLBs and BRAMs.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100 and replaced with one or more of the other varieties of the programmable blocks described. Further, such blocks can be utilized to form a "soft processor" in that the various blocks of programmable circuitry can be used to form a processor that can execute program code as is the case with PROC 110.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. Portions shown in FIG. 1 that are external to PROC 110 such as CLBs 103 and BRAMs 103 are examples of programmable circuitry of the IC.

The functionality of programmable circuitry is not established until configuration data is loaded into the IC. A set of configuration bits can be used to program programmable circuitry of an IC such as an FPGA. The configuration bit(s) typically are referred to as a "configuration bitstream." In this regard, programmable circuitry is not operational or functional without first loading a configuration bitstream into the IC. The configuration bitstream implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry has or includes dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 110 within the IC are for purposes of illustration only and are not intended as a limitation of the one or more embodiments disclosed within this specification.

Figure 2:
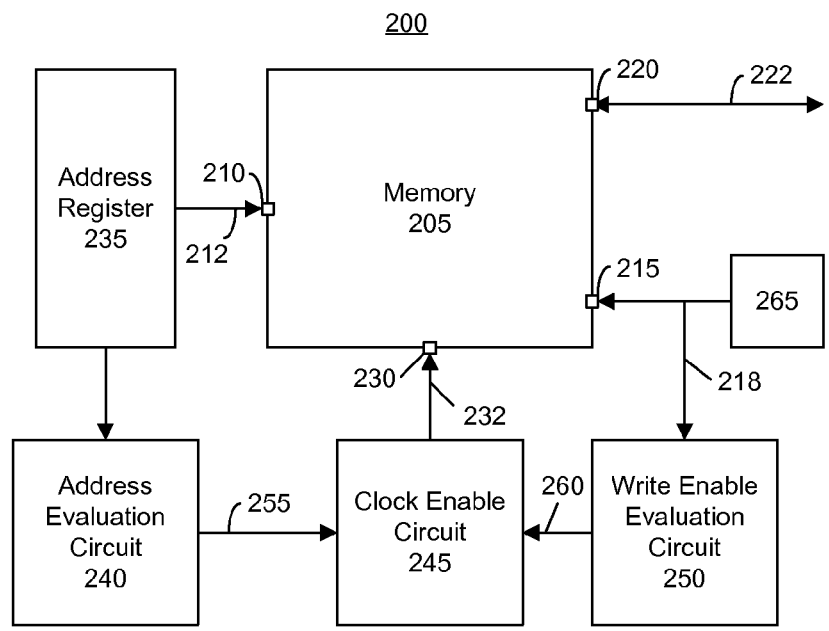
FIG. 2 is a second block diagram illustrating a memory system in accordance with another embodiment disclosed within this specification.

FIG. 2 is a second block diagram illustrating a memory system 200 in accordance with another embodiment disclosed within this specification. Memory system 200 can include a memory 205 and various control circuits. Memory 205 can include an address port 210, a write enable port 215, and a data port 220. Data port 220 can be configured as a write port through which data to be stored is received or a read port from which data to be output is read. Clock signals are not shown in FIG. 2 for purposes of clarity.

Memory 205 can be implemented as any of a variety of different memory circuits. In the example illustrated, memory 205 is a single port memory. In another example, memory 205 can be implemented as a BRAM, or the like, as described with reference to FIG. 1. It should be appreciated that when memory 205 is implemented as a BRAM, memory 205 will have a dedicated read port and a dedicated write port. In any case, memory 205 can be implemented in the form of one or more other memories such as, for example, a dual port memory, a content addressable memory, a first-in-first-out type of memory, or the like. As such, memory 205 is presented for purposes of illustration only and is not intended to limit the one or more embodiments disclosed within this specification.

The control circuits can include an address register 235, an address evaluation circuit 240, a clock enable circuit 245, and a write enable evaluation circuit 250. A clocked circuit element 265 such as a flip-flop or register can be included. While clocked circuit element 265 is illustrated independently of write enable evaluation circuit 250, in one aspect, clock circuit element 265 can be considered part of write enable evaluation circuit 250.

As pictured, address register 235 is coupled to address port 210 via address signal 212. In one aspect, address register 235, in combination with address port 210 and address signal 212, are referred to as an address bus of memory 205. Clocked circuit element 265 is coupled to write enable port 215 and to write enable evaluation circuit 250 through write enable signal 218. Clock enable circuit 245 is coupled to clock enable port 230 via clock enable signal 232. Further, clock enable circuit 245 is coupled to each of address evaluation circuit 240 and to write enable evaluation circuit 250 via control signals 255 and 260 respectively.

Address port 210 is configured to receive address signal 212 specifying an address of memory cell(s) within memory 205 from which data is to be read or to which data is to be written depending upon whether data port 220 is configured for a read or a write operation. In one aspect, memory 205 is operable to store data received through data port 220 responsive to write enable signal 218 received via write enable port 215. Write enable port 215, responsive to write enable signal 218 being asserted, e.g., a logic 1, causes memory 205 to be configured for a data write operation using data port 220. Clock enable circuit 245 generates clock enable signal 232 which, depending upon the state of clock enable signal 232, disables memory 205 or enables memory 205.

For purpose of discussion, assertion of a signal refers to the signal taking on a value corresponding to logic high or logic 1. Accordingly, de-asserting a signal refers to the signal taking on a value corresponding to logic low or logic 0. A de-asserted signal also can be referred to as being "off," whereas an asserted signal can be referred to as being "on." Accordingly, a de-asserted or off control signal is intended to refer to a state of the control signal in which the circuitry controlled by the control signal is placed in an off or inactive operational state. The embodiments disclosed herein are not intended to be limited to such values as one skilled in the art will recognize that alternate embodiments can be implemented in which inverted versions of the signals (e.g., logic) described are used.

In operation, address evaluation circuit 240 is configured to determine whether the address provided to memory 205 via port 210 has changed in a current clock cycle from a previous clock cycle. As used within this specification, the phrase "previous clock cycle" refers to the clock cycle immediately prior to the clock cycle referred to as the current clock cycle. Responsive to address evaluation circuit 240 determining that the address has not changed from the previous clock cycle to the current clock cycle, address evaluation circuit 240 can de-assert control signal 255 to clock enable circuit 245.

Write enable evaluation circuit 250 is configured to determine whether write enable signal 218 has changed from the previous clock cycle to the current clock cycle and further is in a state that disables data write port 220, e.g., is off. Responsive to write enable evaluation circuit 250 determining that write enable signal 218 is in a state that disables data write port 220 for the previous clock cycle and the current clock cycle, write enable evaluation circuit 250 can de-assert control signal 260 to clock enable circuit 245.

Clock enable circuit 245 is configured to assert clock enable signal 232 to clock enable port 230 responsive to receiving either one or both of control signals 255 and 260 being asserted. When both control signals 255 and 260 are de-asserted, clock enable circuit 245 can de-assert clock enable signal 232. Thus, clock enable circuit 245 de-asserts clock enable signal 232 to clock enable port 230 of memory 205, thereby disabling memory 205, responsive to detecting both of the following conditions: (1) the address provided to address port 210 not changing from the previous clock cycle to the current clock cycle and (2) write enable signal 218 being off for the previous clock cycle and the current clock cycle.

The various control circuits described, e.g., address register 235, address evaluation circuit 240, clock enable circuit 245, and write enable evaluation circuit 250 are implemented using programmable circuit blocks as described with reference to FIG. 1. In another embodiment, the control circuits are implemented as hardwired circuits that are considered part of memory 205.

Figure 3:
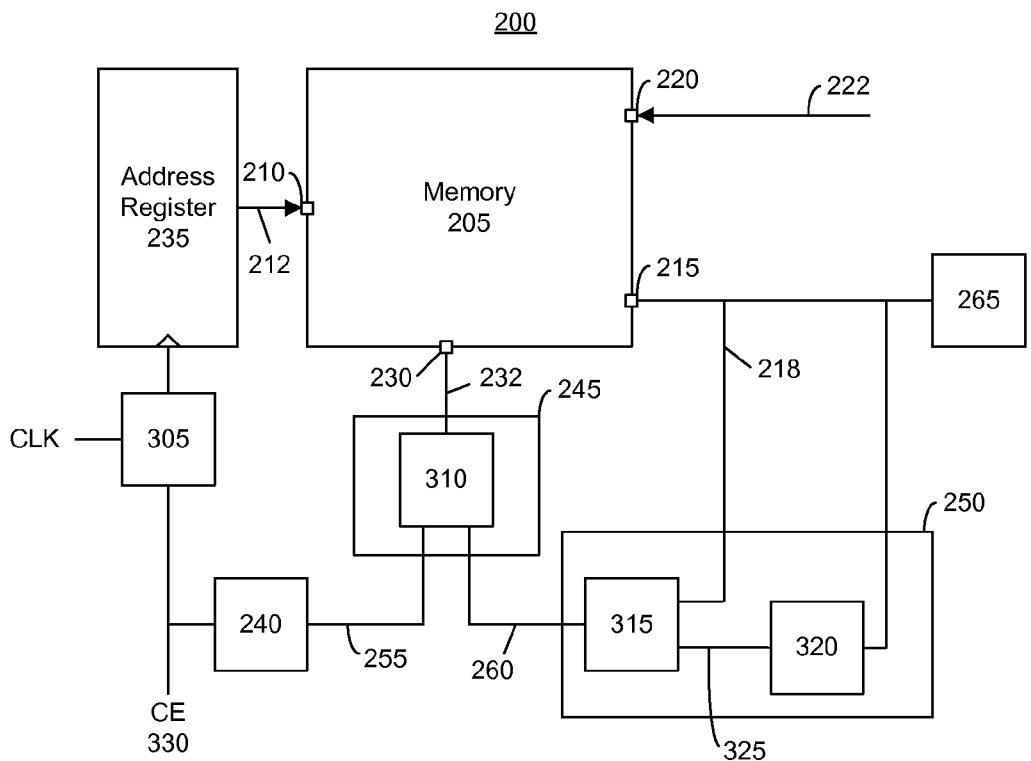
FIG. 3 is a third block diagram illustrating the memory system of FIG. 2 in accordance with another embodiment disclosed within this specification.

FIG. 3 is a third block diagram illustrating memory system 200 in accordance with another embodiment disclosed within this specification. Like numbers will be used to refer to the same items throughout this specification. As described with reference to FIG. 2, memory system 200 includes memory 205, address register 235, and clocked circuit element 265. As pictured, address register 235 includes a clock gate 305. Clock gate 305 receives a clock signal (CLK) and a clock enable (CE) signal 330. Clock gate 305 is configured to pass the clock signal to address register 235 responsive to clock enable signal 330, e.g., when clock enable signal 330 is asserted. Clock enable signal 330 is to be differentiated from clock enable signal 232. Clock enable signal 330 is used to gate the clock signal to address register 235, whereas clock enable signal 232 is used to gate the clock signal to memory 205.

Clock enable signal 330 is also provided to address evaluation circuit 240. Address evaluation circuit 240 can include a delay element. In one embodiment, the delay element implemented by address evaluation circuit 240 is a flip-flop. For example, address evaluation circuit 240 can be implemented as a DQ type of flip-flop in which clock enable signal 330 is provided to the D input and the Q output is provided to clock enable circuit 245 as control signal 255. Accordingly, control signal 255, in FIG. 3, is clock enable signal 330 delayed by one clock cycle, e.g., a delayed version of clock enable signal 330 reflecting the state of the clock enable signal in the previous clock cycle. The example pictured in FIG. 3 illustrates an embodiment in which address evaluation circuit 240 relies upon clock enable signal 330 of address register 235 to determine whether the address specified on the address bus of memory 205 has changed from the previous clock cycle to the current clock cycle.

Address evaluation circuit 240 determines that when clock enable signal 330 is in a state where gate 305 prevents the clock signal from being provided to address register 235 in the previous clock cycle, the address for memory 205 has not changed in the current clock cycle from the previous clock cycle. For example, when clock enable signal 330 is off, gate 305 can prevent the clock signal from being passed to address register 235. Address evaluation circuit 240 passes the delayed version of clock enable signal 330 to clock enable circuit 245 as control signal 255.

Write enable evaluation circuit 250 is implemented using a delay element 320 configured to generate a delayed version of write enable signal 218, denoted as signal 325. In one embodiment, delay element 320 can be implemented as a flip-flop. For example, delay element 320 can be implemented as a DQ type of flip-flop in which write port enable signal 218 is provided to the D input and the Q output is provided to evaluation circuit 315. Evaluation circuit 315 receives signal 325 and write enable signal 218 and is configured to determine, or take, a union of signal 325 and write enable signal 218, which is output as control signal 260. Evaluation circuit 315 can be implemented as any circuit that is configured to perform a union operation. For example, evaluation circuit 315 can be implemented as an OR gate. When both signal 325 and write enable signal 218 are at logic 0, evaluation circuit 315 de-asserts control signal 260 to clock enable circuit 245. When either one or both of signal 325 and write enable signal 218 is at a logic 1, evaluation circuit 315 asserts control signal 260.

Clock enable circuit 245 can be implemented using an evaluation circuit 310. As shown, clock enable circuit 245 receives control signals 255 and 260. Evaluation circuit 310 can be configured to determine, or take, a union of control signals 255 and 260. Evaluation circuit 310 can be implemented as any circuit that is configured to perform a union operation. In one example, evaluation circuit 310 can be implemented as an OR gate. When each of control signals 255 and 260 is off, evaluation circuit 310 de-asserts clock enable signal 232. When either one or both of control signals 255 and 260 is at a logic 1, evaluation circuit 310 asserts clock enable signal 232. Accordingly, when clock enable signal 232 specifies a logic 0, the data stored within memory 205 has not changed from the previous clock cycle. Responsive to receiving a 0 value (e.g., an off) on signal 232, memory 205 is disabled. More particularly, memory 205 is placed in a state that prevents internal signal transitions.

In one aspect, responsive to de-assertion of clock enable signal 232, the clock signal can be gated to one or more or all portions of circuitry within memory 205. In illustration, the clock signal can be gated, e.g., stopped or prevented from switching for the current clock cycle, to output latches of (within) memory 205, address registers of memory 205, input latches of memory 205, or the like.

The example described with reference to FIG. 3 illustrates a case in which the address register includes a clock enable signal. It should be appreciated that in other situations, where clock enable signal 330 is not found, a clock enable signal can be generated that is used to control circuitry that feeds or drives address register 235, but is functionally equivalent to clock enable signal 330 (if present). In one exemplary case, the clock enable signal for the upstream element driving address register 235 can be used. It should be appreciated, however, that one or more additional delay elements, e.g., registers and/or flip-flops, would be required to synchronize the signal with write enable signal 218.

Within this specification, various exemplary implementations of comparison and evaluation circuits are provided. It should be appreciated that one or more other types of circuits, logic or otherwise, that are functionally equivalent to the examples provided can be used. For example, as noted, one or more signals described can be inverted, thereby requiring an alternative type of logic gate or function to be used to achieve a same result as described within this specification. As such, the use of particular logic operations and/or circuits as examples of comparison and/or evaluation circuits are not intended to limit the one or more embodiments disclosed within this specification as any equivalent circuit configuration for comparing and/or evaluating can be used.

Figure 4:
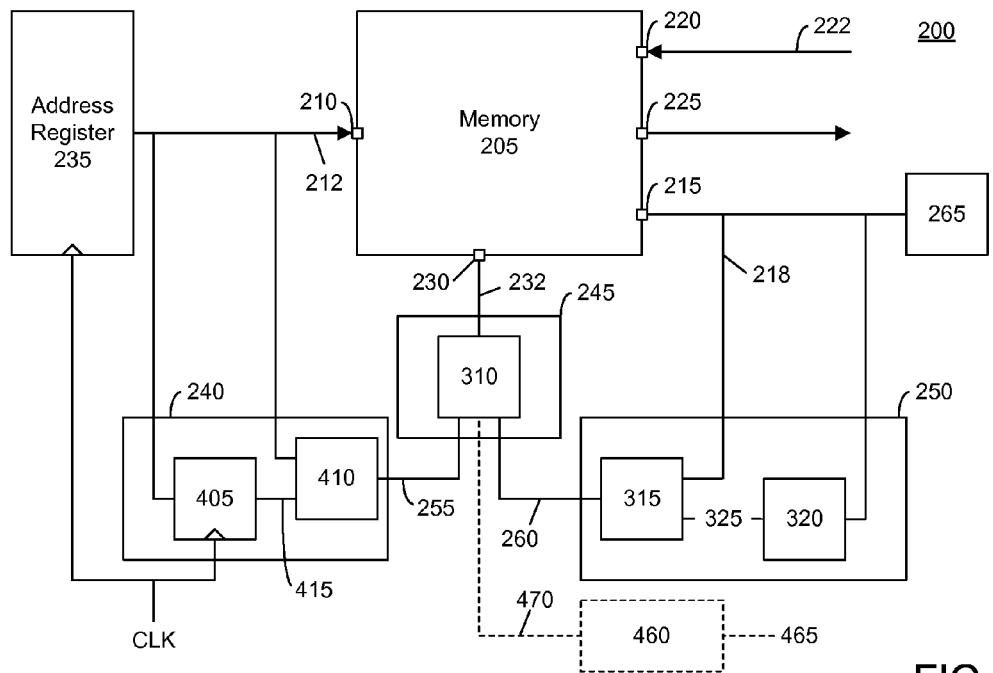
FIG. 4 is a fourth block diagram illustrating the memory system of FIG. 2 in accordance with another embodiment disclosed within this specification.

FIG. 4 is a fourth block diagram illustrating memory system 200 in accordance with another embodiment disclosed within this specification. As described with reference to FIG. 2, memory system 200 includes memory 205, address register 235, and clocked circuit element 265. As pictured, a clock gate is not included to clock enable address register 235. The various control circuits described, e.g., clock enable circuit 245 and write enable evaluation circuit 250 are implemented substantially as described within this specification.

Since address register 235 does not include or utilize a clock enable signal, address evaluation circuit 240 is configured to perform an actual comparison of addresses specified by address signal 212 as provided to write address port 210. As shown, address evaluation circuit 240 can include an additional address register 405, e.g., one or more flip-flops, that receive address signal 212. Address register 405, e.g., a delay element, delays address signal 212 and outputs a signal 415 specifying a delayed version of address signal 212 to comparison circuit 410. Signal 415 specifies the address provided to address port 210 in the previous clock cycle.

Comparison circuit 410 receives signal 415 specifying the address from the previous clock cycle and address signal 212 specifying the address for the current clock cycle. In one example, comparison circuit 410 can be implemented as a circuit configured to perform a logical exclusive OR function, e.g., an exclusive OR gate. For example, comparison circuit 410 can output a logic 0 as control signal 255 only when the address specified by signal 415 is the same as the address specified by address signal 212. Thus, a logic 0 value on control signal 255 indicates that the address did not change from the previous clock cycle to the current clock cycle. As noted, clock enable circuit 245 outputs a value of 0 on clock enable signal 232 when both control signals 255 and 260 are logic 0, thereby disabling memory 205 for the current clock cycle.

As discussed, in one embodiment, the various control circuits described, e.g., address evaluation circuit 240, clock enable circuit 245, and write enable evaluation circuit 250 are hardwired circuits that support the memory being controlled. In another embodiment, the control circuits can be hardwired and incorporated within the memory as a single, larger circuit structure. Further, the various control circuits can be formed using programmable circuitry of an IC such as a programmable IC. Accordingly, in another aspect, an EDA tool can be configured to analyze a circuit design to identify memories therein and add, e.g., insert, when deemed necessary, the control circuits described with reference to either FIG. 3 or FIG. 4.

As previously noted, memory 205 can be implemented as a dual port memory. In that case, write port evaluation circuitry 250 can be duplicated for the second write enable port, which is illustrated as write port evaluation circuitry 460 in dashed line. Write port evaluation circuitry 460 can be implemented substantially the same as, if not identical to, write port evaluation circuitry 250. Write port evaluation circuitry 460, however, can receive the write enable signal for the second write port, illustrated as signal 465, and output a signal 470. Signal 470, generated by write port evaluation circuitry 460, can be provided to clock enable circuit 245 as a third input, e.g., third input to evaluation circuit 310. Accordingly, clock enable signal 232 will be a logic 0 value whenever all of the inputs to evaluation circuit 310 are logic zero values concurrently, thereby disabling memory 205.

Thus, in the case of a dual port memory with the duplicated write port evaluation circuitry, when clock enable signal 232 specifies a logic 0, the data stored within memory 205 has not changed from the previous clock cycle. It should be appreciated that write port evaluation circuitry 460 and signals 465 and 470 are included to demonstrate an embodiment that can be used in the case of a dual port memory and, as such, are not required for embodiments in which a single port memory is used. Write port evaluation circuitry 460 also can be utilized in an embodiment as illustrated in FIGS. 2 and/or 3 in the event memory 205 is implemented as a dual port memory.

Figure 5:
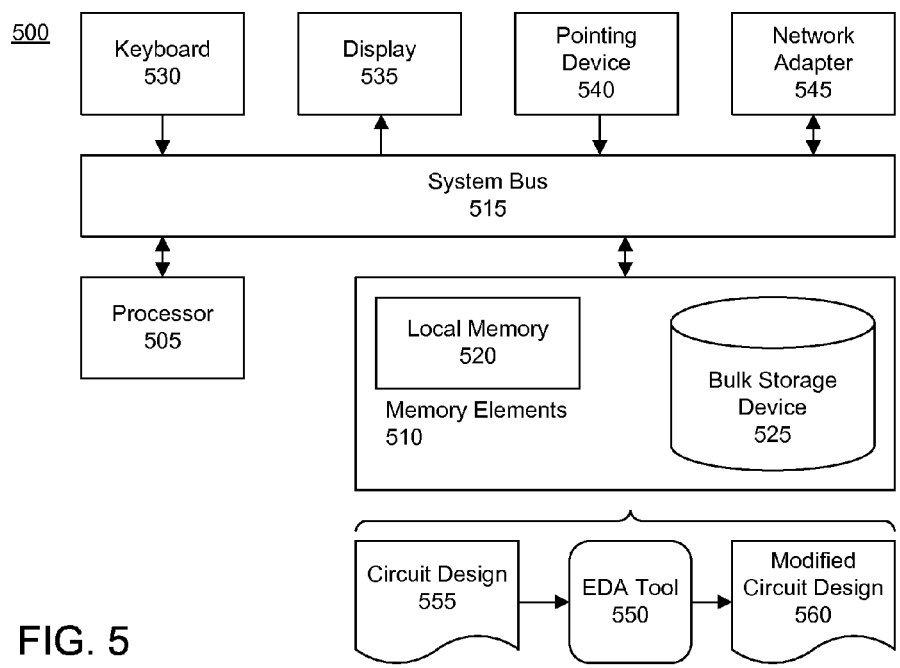
FIG. 5 is a fifth block diagram illustrating an exemplary data processing system in accordance with another embodiment disclosed within this specification.

FIG. 5 is a fifth block diagram illustrating an exemplary data processing system (system) 500 in accordance with another embodiment disclosed within this specification. System 500 includes at least one processor 505 coupled to memory elements 510 through a system bus 515 or other suitable circuitry. As such, system 500 can store program code within memory elements 510. Processor 505 can execute the program code accessed from memory elements 510 via system bus 515. In one aspect, for example, system 500 can be implemented as a computer that is suitable for storing and/or executing program code. It should be appreciated, however, that system 500 can be implemented in the form of any system including a processor and memory that is capable of performing the functions described within this specification.

Memory elements 510 can include one or more physical memory devices such as, for example, local memory 520 and one or more bulk storage devices 525. Local memory 520 refers to random access memory or other non-persistent memory device(s) generally used during actual execution of the program code. Bulk storage device(s) 525 can be implemented as a hard drive or other persistent data storage device. System 500 also can include one or more cache memories (not shown) that provide temporary storage of at least some program code in order to reduce the number of times program code must be retrieved from bulk storage device 525 during execution.

Input/output (I/O) devices such as a keyboard 530, a display 535, and a pointing device 540 optionally can be coupled to system 500. The I/O devices can be coupled to system 500 either directly or through intervening I/O controllers. A network adapter 545 also can be coupled to system 500 to enable system 500 to become coupled to other systems, computer systems, remote printers, and/or remote storage devices through intervening private or public networks. Modems, cable modems, and Ethernet cards are examples of different types of network adapters that can be used with system 500.

As pictured in FIG. 5, memory elements 510 can store an EDA tool 550. EDA tool 550, being implemented in the form of executable program code, can be executed by system 500. EDA tool 550 can process a circuit design 555 specified in programmatic form and generate a modified circuit design 560, also in programmatic form. For example, circuit design 555 and modified circuit design 560 can be specified in the form of a Hardware Description Language (HDL) or the like. It should be appreciated that the particular format or language in which circuit design 555 and modified circuit design 560 are specified is not intended as a limitation of the one or more embodiments disclosed within this specification.

In operation, system 500 can process circuit design 555 by identifying one or more memories specified therein. EDA tool 550 can analyze a programmatic description of a circuit design to identify the various circuit structures and signals noted herein. EDA tool 550 can perform operation such as modifying existing programmatic description, adding programmatic description, and/or removing programmatic description thereby inserting the control circuitry into the circuit design as described herein. For example, system 500 can modify, add, or delete HDL used to specify circuit design 555, thereby creating modified circuit design 560. The added circuitry included within modified circuit design 560 can implement the various control circuits described within this specification, which result in reduced dynamic power dissipation by modified circuit design 560 compared to circuit design 555 when implemented within an IC.

Figure 6:
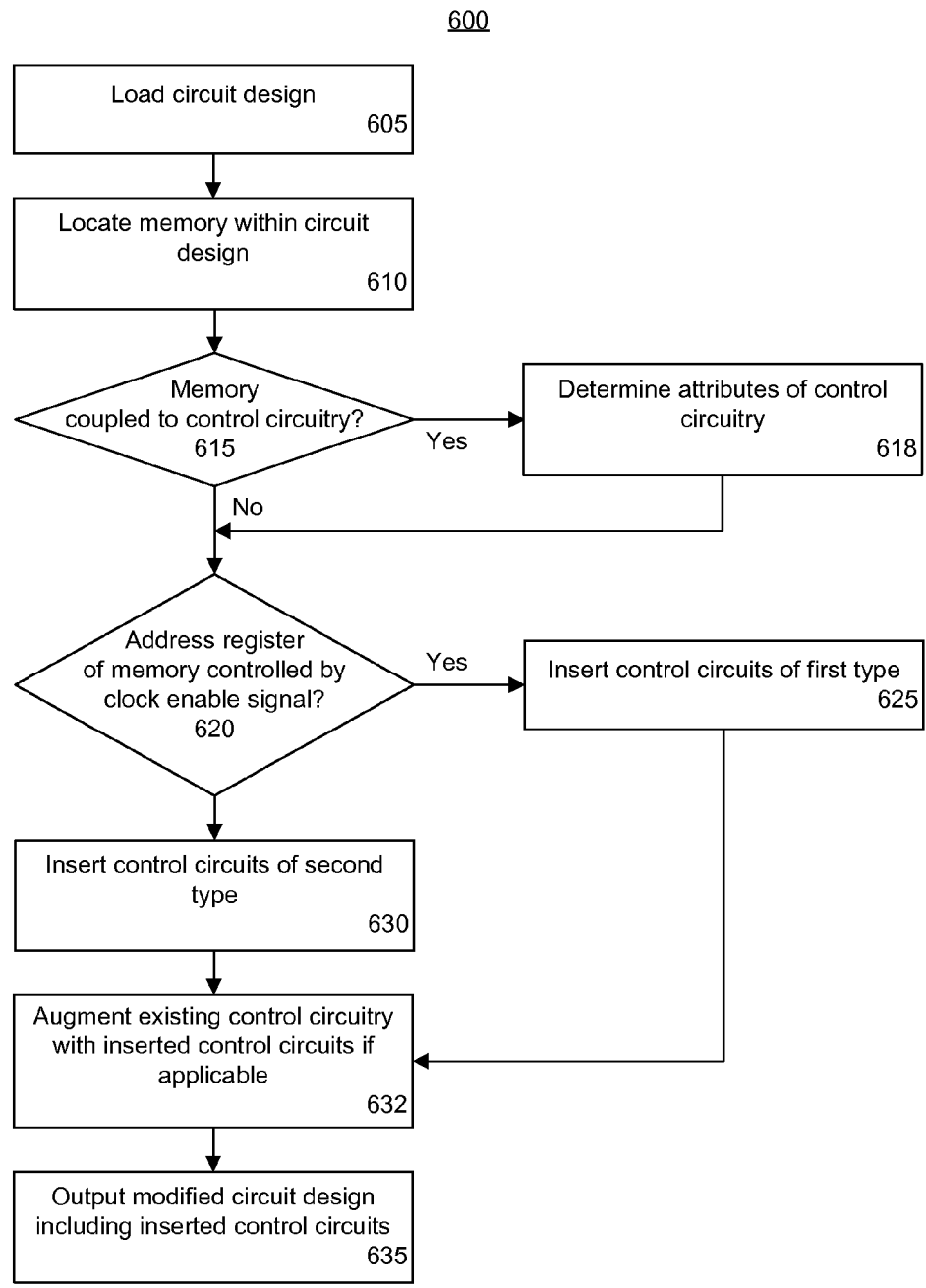
FIG. 6 is a flow chart illustrating a method of processing a circuit design in accordance with another embodiment disclosed within this specification.

FIG. 6 is a flow chart illustrating a method 600 of processing a circuit design in accordance with another embodiment disclosed within this specification. Method 600 can be implemented by a system as described with reference to FIG. 5, for example.

In block 605, the system can load a circuit design. As noted, the circuit design can be specified in programmatic form such as in an HDL or the like. In block 610, the system can locate a memory within the circuit design. For example, the system can search the circuit design for a construct or entity corresponding to a memory.

In block 615, the system can determine whether the memory is coupled to any control circuitry. In one aspect, the system can determine whether a clock enable port of the memory is coupled to circuitry or a signal other than a signal that is set to carry a constant value, e.g., a logic 1, which maintains the memory in a constant and fully enabled state in which the clock signal is not gated. For example, when the system determines that the clock enable of the memory is coupled to a signal with a constant value, e.g., a logic 1, method 600 determines that the memory is not coupled to control circuitry and proceeds to block 620.

When the system determines that the clock enable of the memory is coupled to control circuitry, e.g., other circuitry not tied to a constant value, method 600 can proceed to block 618. In block 618, the system can determine one or more attributes of the control circuitry. For example, the system can identify a control signal, or signals, provided from the control circuitry to the clock enable port so that such control circuitry can be augmented with additional circuitry. Attributes of the existing control circuitry identified by the system can be stored in memory for subsequent use to be described in this specification.

Continuing with block 620, the system determines whether an address bus of the memory has a clock enable signal. Responsive to determining that the address bus of the memory utilizes a clock enable signal, the system can proceed to block 625, where control circuits of a first type, e.g., HDL specifying the control circuits, can be inserted or included within the circuit design. It should be appreciated that signal connections can be modified as may be required within the circuit design to effectuate the inclusion of the control circuits of the first type.

Control circuits of the first type can rely upon the clock enable signal for the address bus to determine whether an address of the memory has changed from the previous clock cycle to the current clock cycle. More particularly, control circuits of the first type can refer to control circuits such as address evaluation circuit 240, clock enable circuit 245, and write port evaluation circuit 250 as described with reference to FIG. 3 of this specification. As discussed, other clock enable signals can be used that are upstream from the address bus. In that case, the number of delays required will vary according to the timing of the clock enable signal used (number of clock signals needed to travel from the upstream element to the memory) with reference to the write enable signal of the memory.

Responsive to determining that the address bus of the memory does not utilize a clock enable signal, the system can proceed to step 630, where control circuits of a second type, e.g., HDL specifying the control circuits, can be inserted or included within the circuit design. As noted, the system can modify signal connections as required to effectuate the inclusion of the control circuitry of the second type within the circuit design. Control circuits of the second type can rely upon a direct comparison of the address specified by the address bus from the previous clock cycle to the address of the address bus specified for the current clock cycle to determine whether the address of the memory has changed. Control circuits of the second type can refer to control circuits such as address evaluation circuit 240, clock enable circuit 245, and write port evaluation circuit 250 as described with reference to FIG. 4 of this specification.

In block 632, the existing control circuits, if any, identified in block 615 are augmented with the control circuits inserted in either block 625 or block 630. For example, any control signals provided by the existing control circuits can be combined in a logically correct fashion with the control signals generated by the control circuits inserted in either block 625 or 630.

In illustration, consider the case in which the existing control circuitry generates a clock enable signal coupled to the clock enable port of the memory and in which a value of logic 0 disables the memory. The clock enable signal from the existing circuitry can be logically combined with the clock enable of the added control circuitry. As one example of logically or otherwise combining the two clock enable signals, an evaluation circuit configured to perform a logical AND operation can be inserted into the circuit design. The evaluation circuit can receive the clock enable signal from the existing circuitry as a first input and the clock enable signal from the inserted control circuitry as a second input. The output from the evaluation circuit can be connected, e.g., directly connected, to the clock enable port of the memory. Thus, the clock enable port of the memory is connected to the output of the evaluation circuit as opposed to being connected to only the clock enable signal of the existing control circuitry or only the clock enable signal of the inserted control circuitry.

The signal that is directly coupled to the clock enable port of the memory is a function of the clock enable signal for the existing control circuits and the clock enable signal generated by the inserted control circuits (e.g., clock enable signal 232). In this example, the memory is disabled responsive to either one or both of the clock enable signal of the existing control circuits or the clock enable signal of the inserted control circuits taking on a value of logic 0.

In block 635, the system can output the modified circuit design that includes the control circuits included in either block 625 or block 630. As used herein, "outputting" and/or "output" can mean writing to a file, writing to a user display or other output device, storing in memory, playing audible notifications, sending or transmitting to another system, exporting, or the like.

FIG. 6 illustrates an exemplary processing technique that can be performed for one memory of a circuit design. It should be appreciated that method 600 can be performed one or more additional times, as needed, to process further memories that may be included within the circuit design.

The embodiments described within this specification can be used in combination with other power reduction strategies such as, for example, techniques implemented by a circuit designer, techniques implemented automatically during synthesis using an EDA tool, or the like including techniques that evaluate the particular circuitry that consumes data output from a memory.

In one or more other embodiments, additional control circuitry can be included that is configurable to override the clock enable signal generated by clock enable circuit 245 for one or more clock cycles responsive to detecting various predetermined operating states within the IC such as, for example, a partial reconfiguration state, a power up state, a global reset state, a testing state, a content initialization state of the memory, or the like. The additional control circuitry can override the clock enable signal generated by clock enable circuit 245 during the enumerated operating states. In some cases, the additional control circuitry can override the clock enable signal for one or more clock cycles after the predetermined operating state ends depending upon the architecture and configuration of the IC. Without such override capability, the clock enable to the memory may be de-asserted thereby preventing intended operation of the memory during such times. For example, the clock enable signal provided from the inserted circuitry to the clock enable port of the memory can be provided to an evaluation circuit that also receives one or more other signals indicating operational state of the IC in which the memory is located. The evaluation circuit can output a logic 0, for example, only when the clock enable signal is a logic 0 and the one or more other signals indicate that the IC is not operating in one of the predetermined operating states.

For purposes of explanation, specific nomenclature is set forth to provide a thorough understanding of the various inventive concepts disclosed herein. The terminology used herein, however, is for the purpose of describing particular embodiments only and is not intended to be limiting. For example, reference throughout this specification to "one embodiment," "an embodiment," or similar language means that a particular feature, structure, or characteristic described in connection with the embodiment is included in at least one embodiment disclosed within this specification. Thus, appearances of the phrases "in one embodiment," "in an embodiment," and similar language throughout this specification may, but do not necessarily, all refer to the same embodiment.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system including a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

Accordingly, the flowchart and block diagrams in the Figures illustrate the architecture, functionality, and operation of possible implementations of systems, methods and computer program products according to various embodiments of the one or more embodiments disclosed herein. In this regard, each block in the flowchart or block diagrams may represent a module, segment, or portion of code, which includes one or more executable instructions for implementing the specified logical function(s). It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The corresponding structures, materials, acts, and equivalents of all means or step plus function elements in the claims below are intended to include any structure, material, or act for performing the function in combination with other claimed elements as specifically claimed.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A circuit, comprising:
   address evaluation circuitry coupled to an address bus of a memory and configured to generate a first control signal responsive to determining that an address on the address bus has not changed for a current clock cycle from a previous clock cycle;
   write enable evaluation circuitry coupled to the memory and configured to generate a second control signal responsive to determining that a write enable signal of the memory is de-asserted for the current clock cycle and for the previous clock cycle; and
   clock enable circuitry configured to generate a clock enable signal coupled to a clock enable port of the memory responsive to the first control signal and the second control signal.

2. The circuit of claim 1, wherein the address evaluation circuitry, the write enable evaluation circuitry, and the clock enable circuitry are incorporated within the memory.

3. The circuit of claim 1, wherein the address evaluation circuitry, the write enable evaluation circuitry, and the clock enable circuitry are implemented using programmable circuit blocks.

4. The circuit of claim 1, wherein the address evaluation circuitry comprises:
   a delay circuit element configured to receive a clock enable signal of the address bus of the memory and generate a delayed version of the clock enable signal for the address bus as the first control signal.

5. The circuit of claim 1, wherein the address evaluation circuitry comprises:
   a delay circuit element configured to receive the address from the address bus of the memory and generate a delayed version of the address; and
   a comparison circuit configured to compare the address with the delayed version of the address and output the first control signal as a result of the comparison.

6. The circuit of claim 1, wherein the write enable evaluation circuitry comprises:
   a delay circuit element configured to receive the write enable signal and generate a delayed version of the write enable signal; and
   an evaluation circuit configured to determine a union of the write enable signal and the delayed version of the write enable signal and output the second control signal as a result of the union.

7. The circuit of claim 1, wherein the clock enable circuitry comprises:
   an evaluation circuit configured to determine a union of the first control signal and the second control signal and output a result of the union as the clock enable signal.

8. A method, comprising:
   determining that a write enable signal of a memory is de-asserted for a current clock cycle and for a previous clock cycle;
   determining that an address on an address bus of the memory has not changed for the current clock cycle from the previous clock cycle; and
   responsive to determining that the write enable signal is de-asserted for the current clock cycle and the previous clock cycle and that the address has not changed for the current clock cycle from the previous clock cycle, de-asserting a control signal to a clock enable port of the memory.

9. The method of claim 8, wherein determining that the address on the address bus has not changed in the current clock cycle from the previous clock cycle comprises:
   determining that a delayed version of a clock enable signal for the address bus is de-asserted for the current clock cycle.

10. The method of claim 8, wherein determining that the address on the address bus has not changed in the current clock cycle from the previous clock cycle comprises:
    comparing an address determined for the current clock cycle with an address determined for the previous clock cycle.

11. The method of claim 8, wherein determining that the address on the address bus has not changed in the current clock cycle from the previous clock cycle comprises:
    generating a delayed version of the address; and
    comparing the address with the delayed version of the address.

12. The method of claim 8, wherein determining that the write enable signal of the memory is de-asserted for the current clock cycle and the previous clock cycle comprises:
  determining a union of a write enable signal provided to the write enable port for the current clock cycle and the write enable signal provided to the write enable port for the previous clock cycle.

13. The method of claim 8, wherein determining that the write enable signal of the memory is de-asserted for the current clock cycle and the previous clock cycle comprises:
  generating a delayed version of the write enable signal; and
  determining a union of the write enable signal and the delayed version of the write enable signal.

\* \* \* \* \*